(12) United States Patent
Farrell

(10) Patent No.: US 6,649,930 B2
(45) Date of Patent: Nov. 18, 2003

(54) THIN FILM COMPOSITE CONTAINING A NICKEL-COATED COPPER SUBSTRATE AND ENERGY STORAGE DEVICE CONTAINING THE SAME

(75) Inventor: Mark Farrell, Georgetown (CA)

(73) Assignee: Energenius, Inc., Markham (CA)

( * ) Notice: Subject to any disclaimer, the term of this patent is extended or adjusted under 35 U.S.C. 154(b) by 0 days.

(21) Appl. No.: 09/891,618

(22) Filed: Jun. 25, 2001

(65) Prior Publication Data

US 2002/0195612 A1 Dec. 26, 2002

Related U.S. Application Data

(60) Provisional application No. 60/124,342, filed on Jun. 27, 2000.

(51) Int. Cl.[7] .............................................. H01L 29/12
(52) U.S. Cl. ........................................ 257/43; 257/766
(58) Field of Search ...................... 257/43, 103, 750, 257/762, 766, 798, 44

(56) References Cited

U.S. PATENT DOCUMENTS

| 4,189,331 A | 2/1980 | Roy ........................... 148/6.31 |
| 5,294,486 A | 3/1994 | Paunovic et al. ........... 428/672 |
| 5,356,661 A | 10/1994 | Doi et al. .................... 427/124 |
| 5,457,079 A * | 10/1995 | Itabashi et al. ............. 502/331 |
| 6,007,925 A * | 12/1999 | Kakizaki et al. ............ 428/623 |
| 6,180,252 B1 * | 1/2001 | Farrell et al. ................ 428/469 |
| 6,207,522 B1 | 3/2001 | Hunt et al. |
| 6,270,835 B1 | 8/2001 | Hunt et al. |
| 6,433,993 B1 | 8/2002 | Hunt et al. |
| 6,541,137 B1 | 4/2003 | Kingon et al. |

FOREIGN PATENT DOCUMENTS

| EP | 0508195 | 10/1991 | ........... C23C/14/12 |
| EP | 0508195 A1 * | 3/1992 | |
| EP | 0908533 | 4/1999 | ........... C23C/28/00 |
| FR | 1118650 | 6/1956 | |
| FR | 1229059 | 2/1960 | |
| GB | 2140460 | 11/1984 | ........... C23C/13/00 |
| JP | 58095301 | 6/1983 | ........... G02B/5/08 |

* cited by examiner

*Primary Examiner*—David Nhu
(74) *Attorney, Agent, or Firm*—Locke Liddell & Sapp LLP

(57) ABSTRACT

The invention relates to a process of preparing a copper/nickel substrate by annealing nickel-coated copper. After the nickel deposition step, a dielectric, such as lead zirconate titanate (PZT), may be deposited onto the substrate by methods known in the art such as sol-gel or vacuum deposition. This invention further relates to thin film composites. These composites include a pre-annealed nickel-coated copper substrate and a dielectric such as PZT.

28 Claims, 5 Drawing Sheets

THIN FILM COMPOSITE CONTAINING A NICKEL-COATED COPPER SUBSTRATE AND ENERGY STORAGE DEVICE CONTAINING THE SAME

This application claims benefit to application/Ser. No. 60/124,342 filed on Jun. 27, 2000.

FIELD OF THE INVENTION

This invention relates to a method of making a nickel-coated copper substrate for use in a thin film composite and thin film composites containing such nickel-coated copper substrates.

BACKGROUND OF THE INVENTION

In the past years, there have been extended efforts in the development of high capacitance electrochemical energy storage devices, especially capacitors and batteries, for use in reduced volumetric areas. Both capacitors and batteries store energy by the separation of positive and negative charges. The need to store greater amounts of energy in a smaller package continues to drive new research Energy storage devices made of thin film composites have been found to be useful in electronic and optoelectronic applications, such as ferroelectric memory devices, pyro-electronic sensor devices, waveguide modulators, and acoustic sensors. For example, thin film composites are used in a variety of semiconductor integrated circuit devices such as analog circuits, rf circuits, and dynamic random access memories (DRAM's).

The composites are usually composed of a substrate, a dielectric, and an electrode; the dielectric being between the substrate and the electrode. Substrates are commonly composed of copper, silicon, fused silica, platinum-coated silicon, alumina, sapphire, platinum-coated sapphire, or a single crystal $SrTiO_3$ substrate.

Copper is often preferred as a substrate in light of its ready availability. Unfortunately, however, thin film composites having copper substrates often evidence thermal migration and outgassing. Thermal migration is the migration of copper ions into the dielectric and of ions in the dielectric into the substrate at elevated temperatures. Outgassing occurs when gaseous copper atoms escape from the substrate into either the dielectric or the oven in which deposition of the dielectric occurs. A copper substrate which eliminates these drawbacks is desired.

SUMMARY OF THE INVENTION

The invention relates to a method of preparing a copper substrate having nickel deposited thereon. In addition, the invention relates to thin film composites containing such nickel-coated copper substrates. The nickel-coated substrate is prepared by depositing nickel onto the copper and then annealing the resulting substrate. The copper may be a foil. After annealing, a dielectric may be deposited onto the substrate by methods known in the art such as by sol-gel or vacuum deposition techniques.

DETAILED DESCRIPTION OF THE PREFERRED EMBODIMENTS

The thin film composites in accordance with the invention contain a nickel-coated copper substrate and a dielectric. The substrate is prepared by depositing nickel onto copper. The nickel may be deposited on one or both sides of the copper substrate. In a preferred embodiment, the nickel encapsulates the copper substrate.

Figure 1:
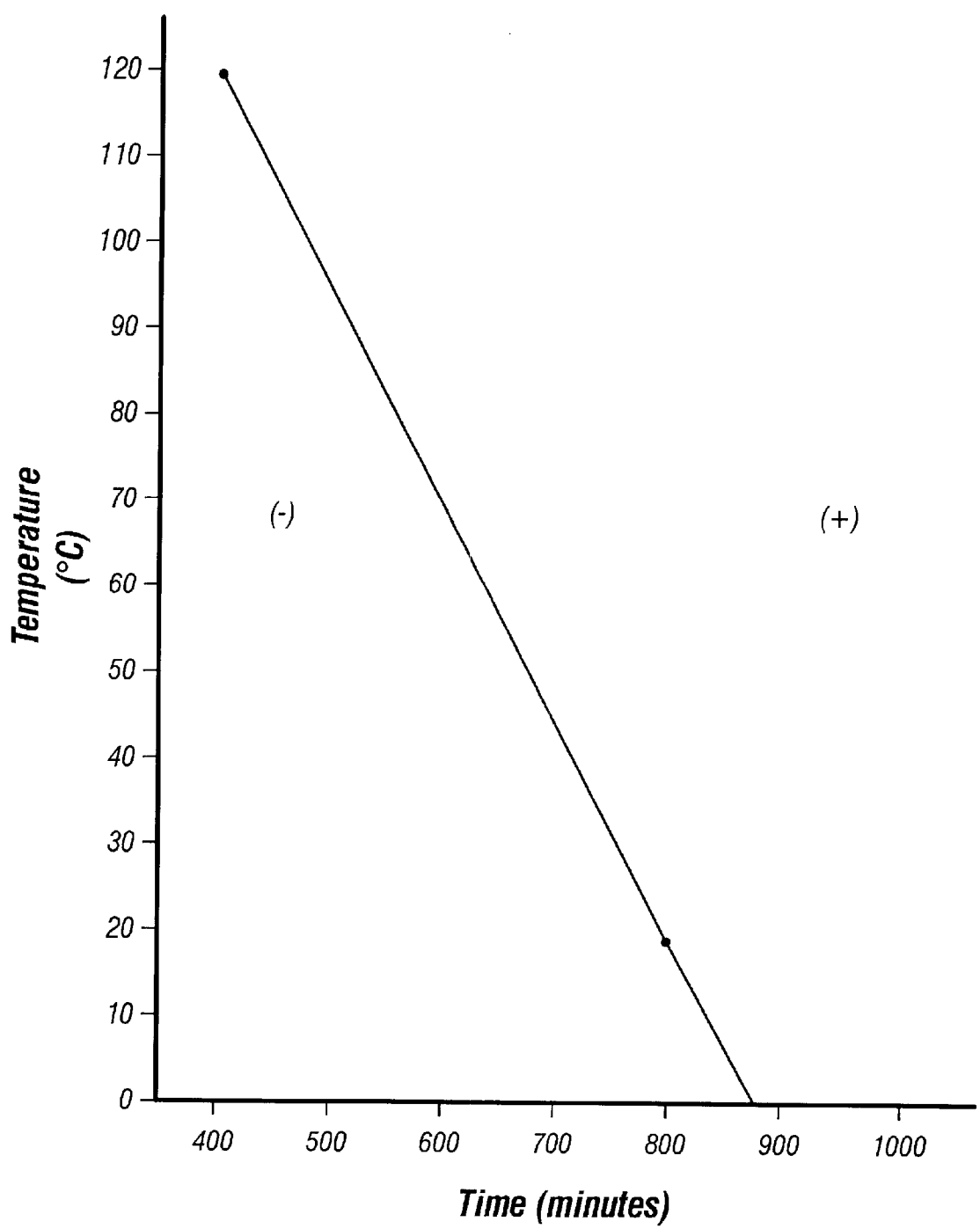
FIG. 1 is a graph depicting optimum temperatures and durations for annealing the nickel-coated substrate in accordance with the process of the invention
Figure 2:
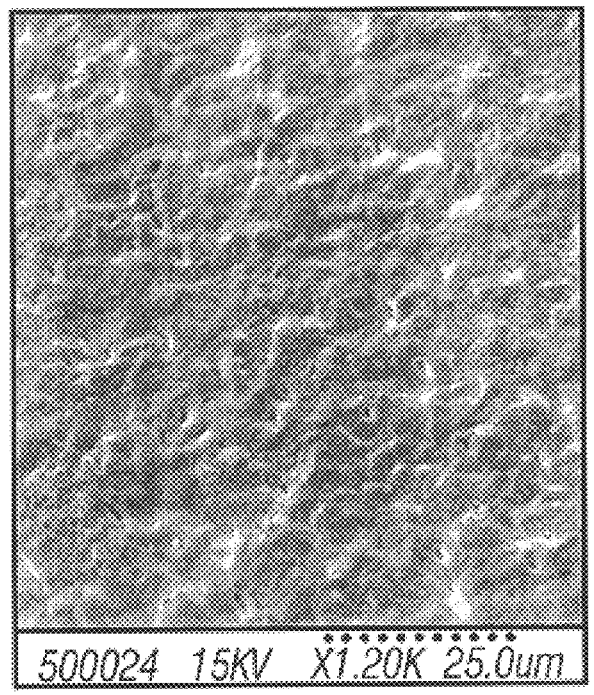
FIG. 2 is an internal structure of a nickel-coated copper substrate pre-annealed at a temperature of 400° C. for 120 minutes using a scanning electron microscope.

The nickel-deposited copper substrate is then annealed at a temperature between approximately 400° C. and 820° C., preferably approximately 800° C. The optimum duration of annealing varies with the annealing temperature. For example, annealing at 400° C. desirably lasts for about 120 minutes, while annealing at 800° C. desirably lasts for about 20 minutes. FIG. 1 illustrates the optimum annealing temperatures and time durations wherein the most preferred temperature and time durations are those points on the line. Less acceptable results causing flawed substrates occur with increasing distance from the line. Flawed substrates include those exhibiting an unacceptable dielectric constant, high voltage leakage, or delamination.

Typically, the thickness of the substrate (prior to the nickel deposition) is between about 20 to about 50 microns. The thickness of the Ni on the side contiguous to the dielectric is between from about 0.10 microns to about 2.0 microns. The thickness of the Ni on the bottommost surface of the substrate (when no dielectric is contiguous therewith) is between 0.1 to about 10 microns.

The nickel may be applied to the copper substrate by sputtering or by other means known in the art. The pre-annealing and nickel deposition steps preferably occur in an atmosphere free of oxygen, such as in a gaseous atmosphere of argon or nitrogen. (Pre-annealing, as used herein, refers to annealing prior to the deposition of dielectric material.)

Deposition of the dielectric on the nickel-coated copper substrate generally requires a low processing temperature to minimize interdiffusion and reaction between the foil and the dielectric. Such dielectrics may further be applied to the substrate by sol-gel (where the deposition occurs at room temperature and thus the annealed nickel-coated copper substrate is cooled to room temperature) or vacuum deposition (including sputtering, electron beam evaporation, and other techniques) where the annealed product is cooled to the temperature at which the deposition occurs. In the latter, for instance, when vacuum deposition is used, the dielectric is applied at elevated temperature of between 300 about 400° C. Deposition of the dielectric may occur in a single step or in multiple steps. The thickness of the dielectric varies depending on the amount of voltage desired of the resulting end product, such as capacitor. The higher the voltage is to be applied, the thicker the dielectric will likely be. A fairly typical thickness for the dielectric is about 600 nm.

In a preferred embodiment, the dielectric is a lead zirconate titanate, PZT, of the formula $Pb_aL_bZr_xTi_yO_z$ wherein L is a lanthanide metal, preferably La or Nb, x and y are independently between from about 0.35 to about 0.65, z is from about 2.5 to about 5.0, a is from about 0.95 to about 1.25 and b is from about 0.02 to about 0.10. Such dielectrics may be prepared by using, as starting materials, lead acetate $[Pb(CH_3COO)_2H_2O)]$, zirconium n-propoxide $[Zr(O—nC_3H_7)_4]$, titanium isopropoxide $[Ti(O—iC_3H_7)_4]$ and lanthanum isopropoxide $[La(O—iC_3H_7)_3]$ or niobium ethoxide $[Nb(OC_2H_5)_5]$. In a preferred method, such dielectrics may be prepared by dissolving lead acetate trihydrate in 2-methoxyethanol and dehydrating the composition at 110° C. under vacuum to obtain lead acetate. Zirconium n-propoxide and titanium isopropoxide in 2-methoxyethanol may then be admixed with the resulting product which is at room temperature, then refluxed at 110° C. for about 2 to 3 hours under vacuum from which polymer precursors, such as those of the formula $Pb(Zr_{0.52}Ti_{0.48})O_3$, may be obtained. Finally, the 0.3 M stock solutions may be obtained by dilution with toluene and adding appropriate formamade for protecting from crack and 10 mol% excess Pb for loss of lead oxide during the final annealing processing.

While conventional dielectrics known in the art may be used, further desirable results are obtained by using the barium titanate dielectrics, especially those of the formula $Ba_aTi_bO_c$ wherein a and b are independently between 0.75 and 1.25 and c is 2.5 to about 5.0 as well as those of the formula $M_aB_bTi_cO_d$ wherein a is about 0.01 to about 0.1, b is about 0.75 to about 1.25, c is about 0.75 to about 1.25 and d is about 2.5 to about 5.0 and M is a non-reactive elctroconductive metal. Preferred as M are gold, copper, intermetallic compounds such as $Ni_3Al$, Ru and InSn. Such barium dielectrics are discussed in PCT WO/98/07167, published on Feb. 19, 1998, herein incorporated by reference.

Figure 3:
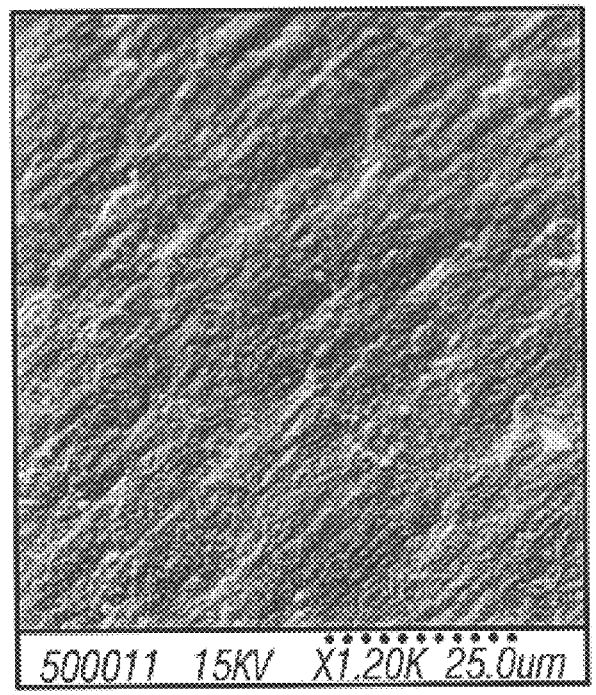
FIG. 3 is an internal structure of a nickel-coated copper substrate pre-annealed at a temperature of 900° C. for 5 minutes using a scanning electron microscope.
Figure 4:
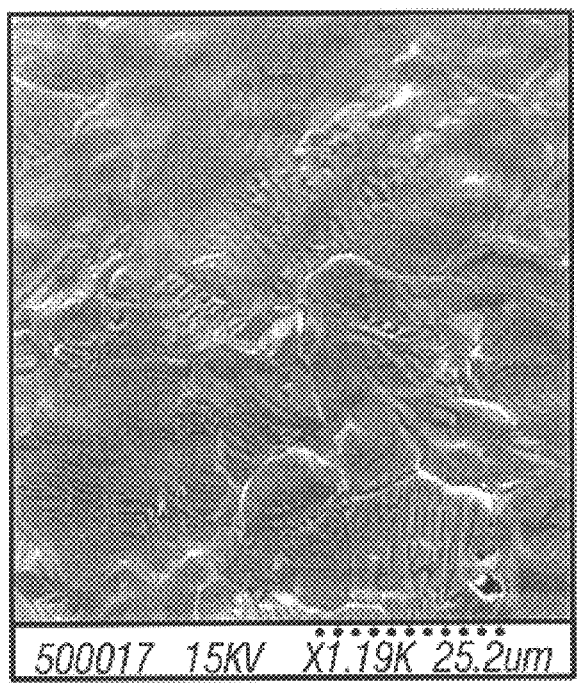
FIGS. 4 and 5 are internal structures of a nickel-coated copper substrate pre-annealed at a temperature of 800° C. for 20 minutes using a scanning electron microscope.
Figure 5:
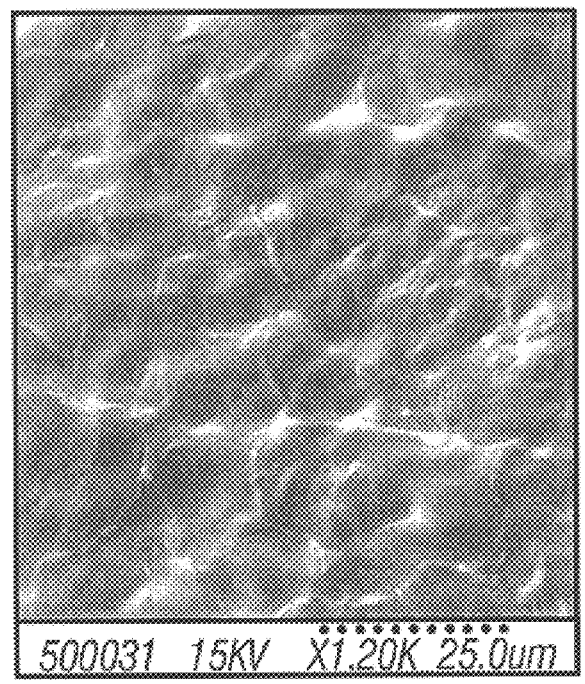
Figure 6:
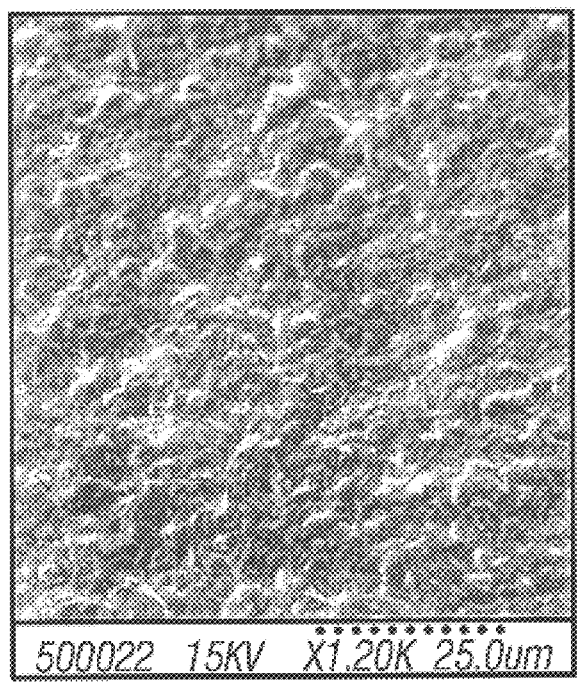
FIG. 6 is an internal structure of a nickel-coated copper substrate pre-annealed at a temperature of 500° C. for 90 minutes using a scanning electron microscope.
Figure 7:
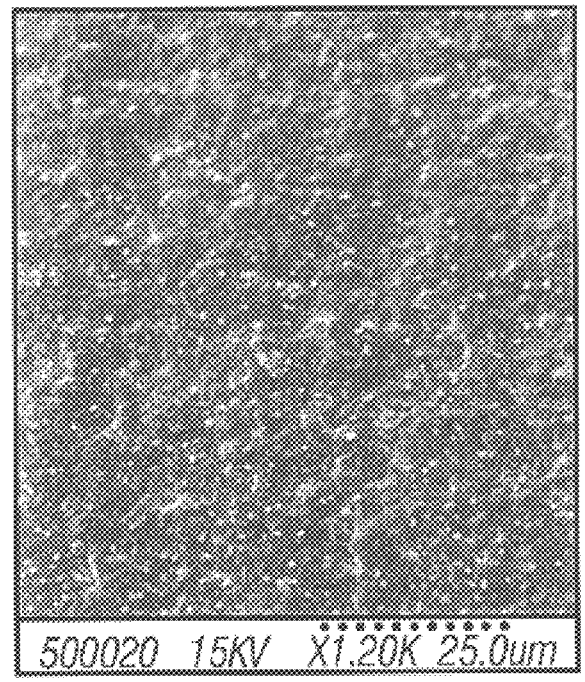
FIG. 7 is an internal structure of a nickel-coated copper substrate pre-annealed at a temperature of 650° C. for 30 minutes using a scanning electron microscope.

Following deposition, the product is annealed at between 500° and 600° C. for about 20 minutes. The annealing temperature at this stage may be shorter if higher temperatures are used. Annealing is terminated when the desired result is achieved. The pre-annealing step should occur at a higher temperature than the annealing temperature for deposition of the dielectric onto the substrate; the latter being referred to as a "post-annealing" step. If the pre-annealing step is at a temperature lower temperature than the post-annealing step, then pre-annealing may proceed at a longer time, generally longer than 20 minutes As set forth in FIG. 2, smooth laminated surface is obtained for the resulting substrate pre-annealed at a temperature of 400° C. for 120 minutes. A dielectric constant of 86 was measured and a Tg δ(%) of 14. FIG. 3 shows the desirable results obtained at pre-annealing conditions of 900° C. for 5 minutes. The substrate had a dielectric constant of 110 and a Tg δ(%) of 7. FIGS. 4 and 5 show the desirable results obtained when the pre-annealing is conducted at 800° C. for 20 minutes. Measured dielectric constants were 75 and 113, respectively. FIGS. 6 and 7 demonstrate less desirable pre-annealing conditions than the preceding FIGS. FIG. 6 is a scanning electromicrograph of a pre-annealed substrate at 500° for 90 minutes. The resulting substrate was rough and exhibited delamination. FIG. 7 is a scanning electromicrograph of a pre-annealed substrate at 650° C. at 30 minutes. The resulting substrate was rough. All of the substrates in FIGS. 2–7 were obtained in an Ar atmosphere and all employed PZT as the dielectric which was deposited onto the substrate by spin-coating. The thickness of the Cu is about 33 to 35.6 microns. The tests were conducted wherein the thickness of the Ni on the uppermost surface contiguous to the dielectric in FIG. 5 was 1.78 microns. The thickness of Ni on the bottommost surface of the substrate (not contiguous with any dielectric) was between 6.35 to 7.62 microns. The thickness of the Ni on the uppermost surface contiguous to the dielectric in FIGS. 2–4 and 6–7 was 0.1270 microns and between 0.3556 to 0.5080 microns on the bottommost surface of the substrate (not contiguous with any dielectric). The thickness of the copper foil for all thin film composites of FIGS. 2–7 is about 34 microns.

Figure 8:
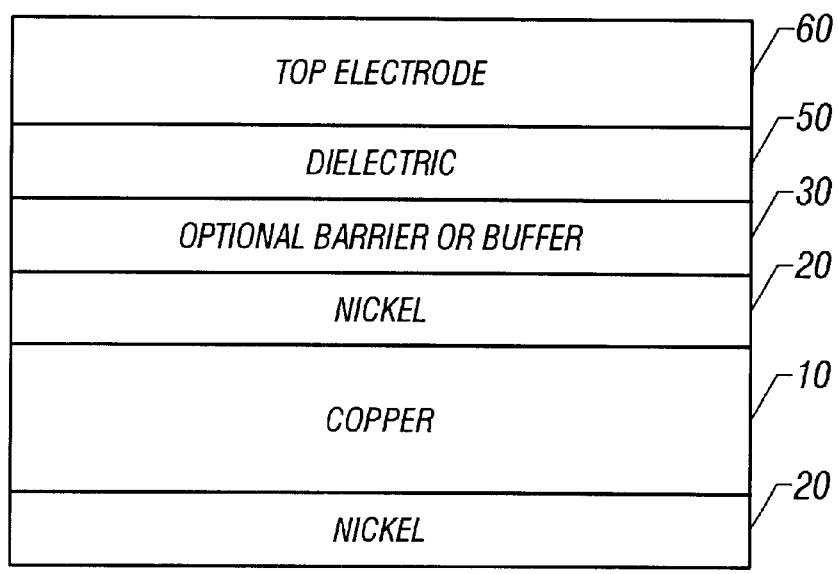
FIG. 8 depicts a thin film composite in accordance with the invention having a copper substrate coated on its top and bottom surfaces with nickel, a dielectric, an optional barrier or buffer layer, and a top electrode.

FIG. 8 refers to an embodiment of the invention wherein the illustrated thin film composite contains a nickel-coated copper substrate comprising copper substrate 10 coated with nickel 20, dielectric 50, and, optionally, top electrode 60. The nickel coating may either envelope the copper substrate completely or partially. Alternatively, the copper substrate on only two sides. FIG. 8 further demonstrates use of a barrier or buffer layer 30 which is applied to the nickel-coated substrate before deposition of the dielectric. The purpose of the barrier layers, generally composed of a noble metal, and the buffer layer, composed of glass, is to prevent atomic migration between the substrate and dielectric.

Lastly, the thin film composites of the invention may further contain a top or electroconductive layer. The top electrode may consist of any electrically conductive metal such as aluminum, gold, platinum, or others known in the art. The thin film composites which are displayed in FIGS. 2–7 had Al as the top electrode.

Figure 9:
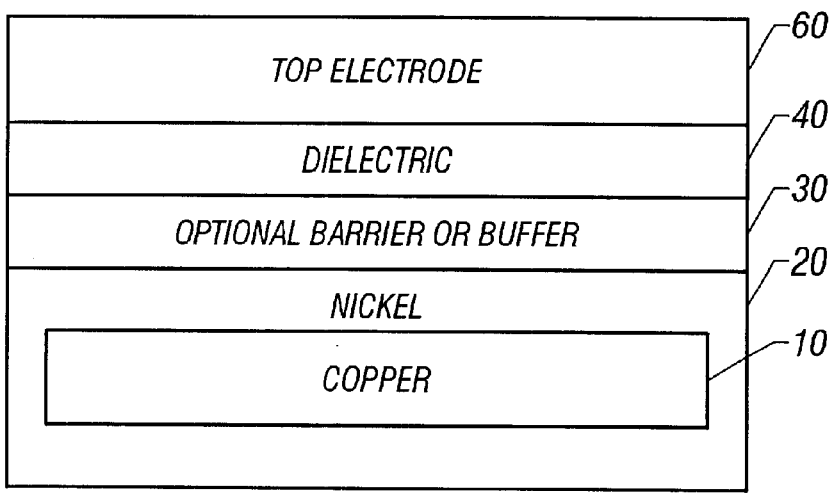
FIG. 9 depicts a thin film composite in accordance with the invention having a copper substrate completely enveloped by nickel.

FIG. 9 depicts a thin film composite wherein the copper substrate 10 is completely enveloped by nickel 20. In addition, this thin film composite may further contain a barrier or buffer layer 30, dielectric 20, and electrode 60.

Various modifications may be made in the nature, composition, operation and arrangement of the various elements, steps and procedures described herein without departing from the spirit and scope of the invention as defined in the following claims.

What is claimed is:

1. A multi-layer thin film composite comprising:
   (a) a nickel-coated copper substrate wherein the nickel is deposited on both sides of the copper substrate;
   (b) a barrier or buffer layer disposed on at least one side of the nickel-coated copper substrate; and
   (c) a dielectric layer on the barrier or buffer layer,
   wherein the barrier or buffer layer prevents atomic migration between the substrate and the dielectric layer.

2. The multi-layer thin film composite of claim 1, wherein both top and bottom surfaces of the nickel-coated copper substrate are coated with the barrier or buffer layer and the dielectric layer.

3. The thin film composite of claim 2, wherein the copper of the nickel-coated copper substrate is encapsulated by nickel.

4. The thin film composite of claim 1, wherein the dielectric of the dielectric layer comprises $Ba_aTi_bOc$, wherein a and b are independently from about 0.75 and to about 1.25 and c ranges from about 2.5 to about 5.0.

5. The thin film composite of claim 1, wherein the dielectric of the dielectric layer comprises $Pb_aL_bZr_xTi_yO_z$, wherein L is a lanthanide metal, x and y independently range between about 0.35 to about 0.65, z is from about 2.5 to about 5.0, a is from about 0.95 to 1.25 and b is from about 0.02 to about 0.10.

6. The thin film composite of claim 1, wherein the barrier or buffer layer is electroconductive.

7. The thin film composite of claim 1, wherein the barrier layer comprises a noble metal.

8. The thin film composite of claim 1, wherein the buffer layer comprises glass.

9. The multi-layer thin film composite of claim 1, wherein the substrate is copper foil.

10. The multi-layer thin film composite of claim 1, wherein the thickness of the nickel on the copper substrate is between from about 0.10 microns to about 2.0 microns.

11. The multi-layer thin film composite of claim 1, wherein the thickness of the copper substrate prior to deposition of the nickel is between from about 20 to about 50 microns.

12. The thin film composite of claim 1, wherein the dielectric of the dielectric layer comprises $M_aB_bTi_cO_d$ wherein a is about 0.01 to about 0.1, b is about 0.75 to about 1.25, c is about 0.75 to about 1.25 and d is about 2.5 to about 5.0 and M is a non-reactive electroconductive metal.

13. The thin film composite of claim 12, wherein M is gold, copper or an intermetallic compound selected from $Ni_3Al$, Ru and InSn.

14. An energy storage device containing the thin film composite of claim 1.

15. A capacitor containing the thin film composite of claim 1.

16. A multi-layer thin film composite comprising:
   (a) an annealed nickel-coated copper substrate; and
   (b) a dielectric layer on the nickel-coated copper substrate.

17. The multi-layer thin film composite of claim 16, wherein the copper of the annealed nickel-coated copper substrate is a foil.

18. The multi-layer thin film composite of claim 16, wherein the annealed nickel-coated copper substrate contains nickel on both sides of the copper substrate.

19. The multi-layer thin film composite of claim 16, wherein the annealed nickel-coated copper substrate is encapsulated by nickel.

20. The multi-layer thin film composite of claim 16, wherein the thickness of the nickel on the side of the annealed nickel-coated copper substrate contiguous to the dielectric layer is between from about 0.10 microns to about 2.0 microns.

21. An energy storage device containing the multi-layer thin film composite of claim 16.

22. A capacitor containing the multi-layer thin film composite of claim 16.

23. A multi-layer thin film composite comprising:
   (a) an annealed nickel-coated copper substrate wherein the copper substrate is coated on the top and bottom surfaces with nickel;
   (b) a dielectric layer on bottom and top surfaces of the annealed nickel-coated copper substrate; and
   (c) a barrier layer or a buffer layer between each of the top and bottom surfaces of the nickel-coated copper substrate and the dielectric layer.

24. The thin film composite of claim 23, wherein the copper of the copper substrate is a foil.

25. The thin film composite of claim 16, wherein the annealed nickel-coated copper substrate is encapsulated by nickel.

26. The multi-layer thin film composite of claim 23, wherein the copper of the copper substrate is a foil.

27. An energy storage device containing the thin film composite of claim 23.

28. A capacitor containing the thin film composite of claim 23.

* * * * *